(12) United States Patent
Tokuoka et al.

(10) Patent No.: US 6,550,117 B1
(45) Date of Patent: Apr. 22, 2003

(54) MULTILAYER CERAMIC ELECTRONIC ELEMENT AND MANUFACTURING METHOD THEREFOR

(75) Inventors: Yasumichi Tokuoka, Chiba (JP); Takeshi Nomura, Chiba (JP)

(73) Assignee: TDK Corporation, Tokyo (JP)

( * ) Notice: Subject to any disclaimer, the term of this patent is extended or adjusted under 35 U.S.C. 154(b) by 255 days.

(21) Appl. No.: 09/595,912

(22) Filed: Jun. 20, 2000

Related U.S. Application Data

(62) Division of application No. 09/203,400, filed on Dec. 2, 1998, now abandoned.

(30) Foreign Application Priority Data

Dec. 3, 1997 (JP) ............................................. 9-332719

(51) Int. Cl.⁷ ................................................. H01G 7/00
(52) U.S. Cl. ....................... 29/25.42; 29/25.41; 29/830; 29/831; 156/89.12
(58) Field of Search ............................... 29/25.42, 830, 29/831, 842, 846, 851, 25.41; 361/303, 306.1, 306.3, 308.1, 309, 310, 311, 312, 313, 321.1–321.5; 156/89.12, 89.16, 89.23, 235, 239

(56) References Cited

U.S. PATENT DOCUMENTS

| | | | | |
|---|---|---|---|---|
| 5,004,640 A | * | 4/1991 | Nakatani et al. | 428/195 |
| 5,182,695 A | * | 1/1993 | Handa et al. | 361/321 |
| 5,679,472 A | * | 10/1997 | Wu et al. | 428/690 |
| 5,700,548 A | * | 12/1997 | Warnier et al. | 428/209 |

FOREIGN PATENT DOCUMENTS

| | | |
|---|---|---|
| JP | 52-133553 | 11/1977 |
| JP | 52-135050 | 11/1977 |
| JP | 52-135051 | 11/1977 |
| JP | 53-42353 | 4/1978 |
| JP | 57-193091 | 11/1982 |
| JP | 60-219790 | 11/1985 |
| JP | 61-102719 | 5/1986 |
| JP | 1-129492 | 5/1989 |
| JP | 5-116465 | 5/1993 |
| JP | 2636306 | 4/1997 |
| JP | 2636307 | 4/1997 |

* cited by examiner

*Primary Examiner*—David J. Walczak
(74) *Attorney, Agent, or Firm*—Oblon, Spivak, McClelland, Maier & Neustadt, P.C.

(57) ABSTRACT

Internal electrode layers of a multilayer ceramic electronic element are structured such that spaces, which are formed between adjacent internal electrodes, are eliminated so as to substantially flatten the internal electrode layers. Moreover, the thickness of each green dielectric layer is reduced. To achieve this, a laminating process is performed by a thermal transfer printing method such that a thermal transfer conductor material and a thermal transfer dielectric material are used so as to form internal electrode portions and green dielectric portions. Thus, the internal electrode layers are formed.

5 Claims, 3 Drawing Sheets

MULTILAYER CERAMIC ELECTRONIC ELEMENT AND MANUFACTURING METHOD THEREFOR

This application is a division of application Ser. No. 09/203,400, filed Dec. 2, 1998, now abandoned.

BACKGROUND OF THE INVENTION

The present invention relates to a structure of multilayer electronic elements for use widely in electric products and a manufacturing method therefor, and more particular to a multilayer ceramic chip capacitor and a manufacturing method therefor.

A multilayer ceramic chip capacitor is usually manufactured by the following process.

Initially, a coating material is prepared in which dielectric particles and a binder are dispersed in a solvent. The surface of a support member, made of polyethylene terephthalate or the like, is coated with the coating material so that a green dielectric layer is formed. Then, a conductor pattern (a green internal electrode portion) for the internal electrode is formed on the green dielectric layer. The green internal electrode portion is usually formed by, for example, screen-printing conductor paste. Then, the support member is separated from the green dielectric layer which has the green internal electrode portion. While the positions of the green internal electrode portions are being aligned, a plurality of the green dielectric layers are laminated. Thus, a green laminate is formed.

The obtained green laminate is applied with pressure and compressed, and then cut into a predetermined size. Thus, green chips (divided green laminates) are manufactured. Then, the green chips are burned at predetermined temperatures in a predetermined atmosphere so that sintered bodies are obtained. Then, paste for forming external electrodes is applied to ends of the sintered body so that a multilayer ceramic chip capacitor is manufactured.

FIG. 4A is a schematic view showing the internal structure of the green laminate realized during the process for manufacturing the multilayer ceramic chip capacitor. As shown in FIG. 4A, the multilayer ceramic chip capacitor is constituted by laminating and burning dielectric layers 62 each having a conductor pattern 61 for the internal electrode.

As shown in FIG. 5, the multilayer ceramic chip capacitor is constituted by alternately laminating internal electrodes 61 connected to external electrodes 63 disposed opposite to each other. The green internal electrode portions 61 are laminated on the green dielectric layer as follows: In FIG. 4C which is a cross sectional view taken along a first cutting direction x–x' shown in FIG. 4A, the green internal electrode portions 61 are aligned through green dielectric layers 62. In FIG. 4B which is a cross sectional view taken along a second cutting direction y–y', the green internal electrode portions 61 are alternately laminated. The green dielectric layers 62 are cut along cutting lines 64 so that green chips are obtained.

The foregoing structure is formed such that the green internal electrode portions 61 are formed and laminated on the green dielectric layers 62. As shown in FIGS. 4B and 4C, spaces 65 are formed among adjacent green internal electrode portions in the green internal electrode layers. That is, first portions 66 in which the green internal electrode layers and green dielectric layers are alternately laminated and second portions 67 coexist in the green laminate, the second portions 67 being laminated through spaces interposed between upper and lower green dielectric layers. When multilayer ceramic chip capacitors are manufactured by burning the green laminate, the burning process is performed in a state in which the spaces 65 adjacent to the external electrodes are compressed, as shown in FIG. 5. Therefore, the internal electrodes are not flush with one another. That is, the ends of the internal electrodes are warped, causing the thicknesses to be made different among the ends and the central portion.

The degree of compression of the spaces 65 shown in FIGS. 4B and 4C is raised in proportion to the number of laminated layers. Therefore, stepped portions between the first portions 66 and the second portions 67 are enlarged excessively. Thus, the first portions 66 in the form of a laminate which is constituted by dint of hermetic contact between the green internal electrode layers and the green dielectric layers are greatly raised. Since the first portions 66 are pressed and compressed under high pressures as compared with those applied to the second portions 67, the densities of the first portions 66 and those of the second portions 67 are made to be different from one another. As a result, chip capacitors, which are final products, are deformed, cracks are formed and delamination takes place.

If the thickness of the green dielectric layer is reduced to achieve size reduction and enlargement of the capacity of the capacitor which have been required in recent years, the green dielectric layer can easily be cut in the stepped portion. Therefore, there arises a problem of, for example, short circuit occurring between the internal electrodes.

To overcome the problem caused from the rise of the green internal electrode portion, a variety of suggestions have been made.

In Unexamined Japanese Patent Publications 52-135050 and 52-133553, structures have been suggested in each of which a green dielectric space sheet having a gap corresponding to the green internal electrode portion is interposed in the green laminate so as to prevent a stepped portion.

The dielectric green space sheet must have the same thickness as that of the green internal electrode portion. If the thickness of the green internal electrode portion is 10 μm or smaller, the green dielectric space sheet cannot accurately be punched to have the same shape as that of the pattern of the internal electrode so as to be inserted as described above. What is worse, processes for laminating some hundreds of layers must be performed such that insertion of the dielectric space sheet is performed for each layer. Therefore, mass production cannot easilybe performed.

A similar method has been disclosed in Unexamined Japanese Patent Publication 53-42353, in which recesses are formed in the portions of the green dielectric layers corresponding to the internal electrodes. Thus, the green internal electrode portions are embedded in the recesses to eliminate the spaces in the green laminate so as to flatten the structure. Another method has been disclosed in Unexamined Japanese Patent Publication 61-102719 in which the green internal electrode portions and the green dielectric sheets are punched to have predetermined shapes to alternately be laminated so as to eliminate the spaces in the laminate. Thus, the structure can be flattened. Each of the above-mentioned suggestions, however, requires a very thin green dielectric sheet to be handled. Therefore, mass production cannot easily be performed.

In Unexamined Japanese Patent Publication 52-135051, a method has been suggested in which a coating process for forming the green internal electrode portions is performed. Then, the space portions are coated with the green dielectric layers to flatten the surfaces of coating so as to laminate the layers. However, seepage of the pattern and erosion by dint of the solvent easily take place vertically or between the adjacent green internal electrode portions and the green dielectric layers. If the thickness of the green dielectric layer interposed between the green internal electrode portions formed vertically is reduced, the boundaries between the green internal electrode portions and the green dielectric layers are obscured by dint of the seepage of the pattern and erosion of the solvent. In this case, there is apprehension that a problem of short circuit between the internal electrodes arises.

Although the techniques of flattening the internal portion of the laminate to eliminate the spaces have been suggested, the foregoing structures have not been put into practical use because the thin green dielectric sheet cannot easily be handled.

In Japanese Patent Publication No. 2636306 and Japanese Patent Publication No. 2636307, techniques have been suggested in which the green internal electrode portions are first formed on the support members. Then, the green dielectric layers are formed by a coating process so as to embed the green internal electrode portions in the green dielectric layers. Thus, the surfaces of the internal electrode are flattened so that thin layers each having a thickness of 18 $\mu$m is formed.

The above-mentioned method, however, cannot easily prevent rise of the green internal electrode portion if the thickness of the green dielectric is furthermore reduced.

As described above, the conventional methods are effective in only a case where the green dielectric layer has a relatively large thickness. If the thickness of the green dielectric layer is reduced, there arises problems of difficulty in performing mass production and unsatisfactory machining accuracy. Moreover, the surface of the laminate cannot be flattened.

Although the multilayer ceramic chip capacitor has been described, the other multilayer ceramic electronic elements encounter similar problems when the thickness of each layer is reduced.

At present, multilayer ceramic electronic elements, and more particularly multilayer ceramic chip capacitors are required to have small sizes because apparatuses incorporating the foregoing electronic elements are required to have reduced sizes and weights. Therefore, the thicknesses of all laminated layers of the multilayer ceramic electronic element must be reduced. However, there is apprehension that a multiplicity of the problems including the short circuit between the internal electrodes arise owning to the foregoing structure.

SUMMARY OF THE INVENTION

Accordingly, an object of the present invention is to provide a multilayer ceramic electronic element having a small size and satisfactory reliability and which can easily be manufactured and a method of manufacturing the multilayer ceramic electronic element.

To solve the foregoing problems, the present invention is characterized by the following structures:

A multilayer ceramic electronic element comprises: ceramic dielectric layers; internal electrode layers; and external electrodes for establishing connection with the outside such that the ceramic dielectric layers and the internal electrode layers are alternately laminated, wherein the internal electrode layer has an internal electrode portion and a dielectric portion which are continuously flushed with each other, and an end of the internal electrode portion is connected to the end external electrode without any curvity.

Further, an multilayer ceramic electronic element as mentioned above, in that the thickness of an internal electrode in each of the internal electrode layers is not larger than 1.2 $\mu$m, and the thickness of ceramic dielectric substance interposed by the internal electrodes is not larger than 2 $\mu$m.

Furthermore, multilayer ceramic electronic element as mentioned above, wherein at least fifty ceramic dielectric layers and internal electrode layers are alternately laminated.

A method of manufacturing a multilayer ceramic electronic element, comprises the steps of: forming a green internal electrode portion by thermally transfer-printing, on a green dielectric substances formed on a support member, a thermal transfer conductor material by a thermal transfer printing method; and forming a green dielectric portion by thermally transfer-printing, on the surface of the green dielectric layer in which the green internal electrode portion is not formed and which is flush with the green internal electrode portion, a thermal transfer dielectric material by a thermal transfer printing method so that a substantially flat green internal electrode layer is formed.

Further, in a method of manufacturing a multilayer ceramic electronic element, the green dielectric layer formed on the support member is formed by a thermal transfer printing method using a thermal transfer dielectric material.

Furthermore, in a method of manufacturing a multilayer ceramic electronic element, the thermal transfer conductor material is formed by sequentially laminating, on the support member, a separation layer mainly composed of wax, a conductor layer mainly composed of thermoplastic resin, wax and conductor particles or the thermoplastic resin and the conductor particles and an adhesive layer mainly composed of thermoplastic resin and wax or the thermoplastic resin and the thermal transfer dielectric material is formed by sequentially laminating, on the support member, a separation layer mainly composed of wax, a dielectric layer mainly composed of thermoplastic resin, wax and dielectric particles or the thermoplastic resin and the dielectric particles and adhesive layer mainly composed of thermoplastic resin and wax or the thermoplastic resin.

Furthermore, in a method of manufacturing a multilayer ceramic electronic element, the surface of a green internal electrode layer, which incorporates a green internal electrode portion formed on the surface of a green dielectric layer formed on the support member by a thermal transfer method and a green dielectric portion, is subjected to a calendering process so that the surface of the green internal electrode layer is flattened.

Green internal electrode portions in a green laminate which is a precursor of a multilayer ceramic electronic element must be formed as follows: spaces which are formed between adjacent internal electrodes are eliminated so as to form substantially flat green internal electrode layers. Moreover, the thicknesses of burned ceramic dielectric layers must be reduced. Therefore, a laminating process is performed such that a thermal transfer conductor material and a thermal transfer dielectric material are used to form green internal electrode portions and green dielectric portions by a thermal transfer printing method. Thus, green internal electrode layers are formed. Also the green dielectric layers can be formed by the thermal transfer printing method.

In general, the thermal transfer printing method has the following advantages: no drying process is required because a dry process is performed such that a thermal transfer sheet manufactured previously is used to form a pattern. Moreover, a necessity of making a new printing plate, which is required for the screen printing method for the purpose of changing the pattern, can be eliminated. Thus, an arbitrary pattern can quickly be formed. When the thickness of a pattern is reduced, seepage occurring when the screen printing process is performed can be prevented. As a result, an accurate pattern can easily be formed. Therefore, when the thermal transfer printing method is employed to form the green internal electrode layers, the green internal electrode portions and the green dielectric portions can easily successively be formed. Also their boundaries are free from seepage from the green internal electrode portions and the green dielectric portions. Thus, the thin layers can easily be handled and the structure can be simplified. Therefore, a reliable and compact multilayer electronic element can easily be manufactured.

The thermal transfer printing method is performed such that a thermal transfer dielectric material or a conductor material is brought into hermetic contact with the printing surface of a medium, for example, a green dielectric layer, which must be printed. Then, a heating unit, such as a thermal head, is operated to heat the thermal transfer member from the rear side of the same so that a required shape is obtained by the printing method.

DETAILED DESCRIPTION OF THE PREFERRED EMBODIMENTS

An embodiment of a thermal transfer member is described with reference to FIG. 1.

Figure 1:
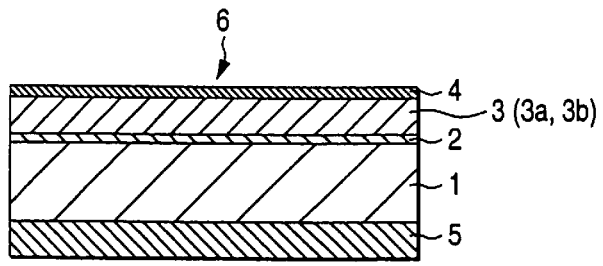
FIG. 1 is a cross sectional view showing the structure of a thermal transfer member.

A thermal transfer member 6 shown in FIG. 1 has a support member 1 on which a separation layer 2 mainly composed of wax is formed. A conductor layer or a dielectric layer 3 is formed on the separation layer 2. An adhesive layer 4 is formed on the dielectric layer 3. A backcoat layer 5 is formed below the support member.

When the thermal transfer printing process is performed, the adhesive layer 4 made on the thermal transfer member is disposed to oppose a green dielectric layer which is a printing medium. Then, a thermal head or the like which is a heating unit having an arbitrary shape is operated to heat, into a predetermined pattern, the structure from a position on the outside of the backcoat layer 5. As a result, an arbitrary shape can be printed. Since the separation layer 2 mainly composed of wax is formed by the conductor layer or the dielectric layer 3 and the support member 1, the separation effect of the wax enables the dielectric layer 3 to easily be punched from the support member 1 into the shape of the heating pattern. As a result of the adhesive effect of the adhesive layer 4, the conductor layer or the dielectric layer 3 punched to have the arbitrary shape can stably be fixed to the green dielectric layer which is the printing medium.

The thermal transfer printing method is able to cause the thermal head to generate heat to correspond to information of a pattern having an arbitrary shape by using, for example, a display unit of a computer. Therefore, an arbitrary pattern can precisely be printed by using the foregoing thermosensitive material. When the thermal transfer printing method is employed to print the green internal electrode portions and the green dielectric portion onto the surface of the green dielectric layer which is the printing medium, the green internal electrode layer can substantially be flattened. As a result, an accurate green laminate can be formed.

A representative multilayer ceramic chip capacitor which is the multilayer ceramic electronic element will now be described with reference to the drawings.

FIG. 2 is a schematic view showing a laminate incorporating a green internal electrode layer according to the present invention.

Figure 2A:
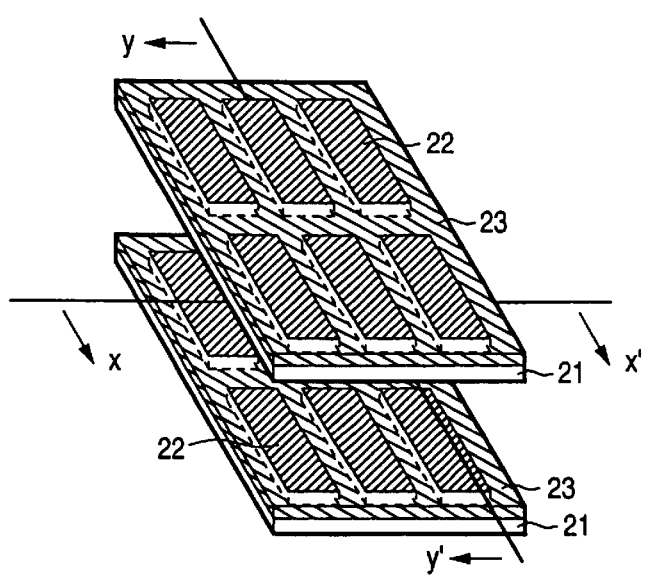
FIGS. 2A, 2B and 2C are diagrams showing the structure of a laminate according to the present invention.

As shown in FIG. 2A, green internal electrode portions 22 are disposed on a green dielectric layer 21. Moreover, green dielectric portions 23 are disposed to bridge gaps among the green internal electrode portions 22. Thus, a green internal electrode layer which is a layer including the green internal electrode portions 22 and the green dielectric portions 23 can substantially be flattened. When the formed green sheets are laminated, a green laminate having the layers laminated precisely can be obtained. Therefore, rise of the green internal electrode portion 22 to pierce the green dielectric layer 21 can be prevented. Thus, deterioration in the reliability can be prevented.

Figure 2B:
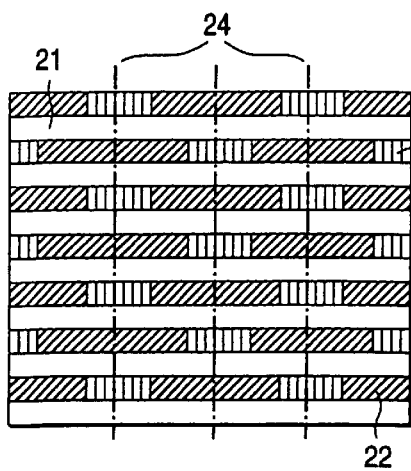
Figure 2C:
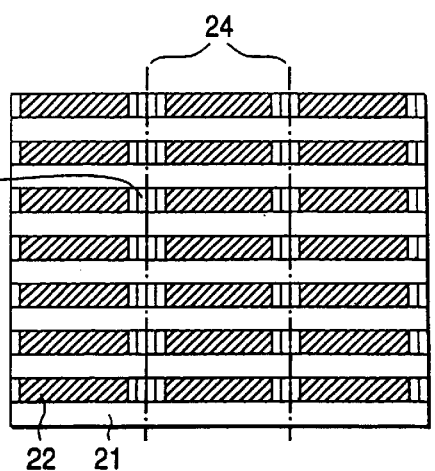

FIG. 2B shows a cross section obtained by cutting the foregoing laminate along line y–y'. FIG. 2C shows a cross section obtained by cutting the laminate along line x–x'. As can be understood from the drawings, the green internal electrode portions 22 and the green dielectric portion 23 are disposed on the green dielectric layers 21. Thus, the green internal electrode layers can be flattened. Moreover, the layers are orderly laminated.

Figure 3:
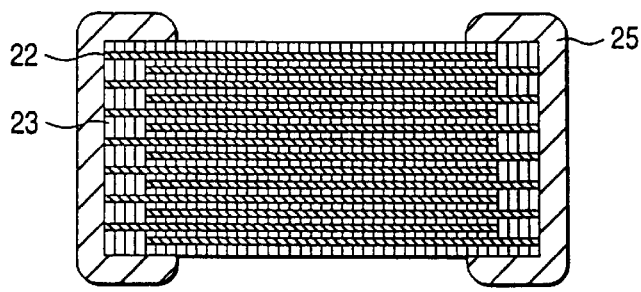
FIG. 3 is a cross sectional view showing a multilayer ceramic chip capacitor having a structure according to the present invention.
Figure 4A:
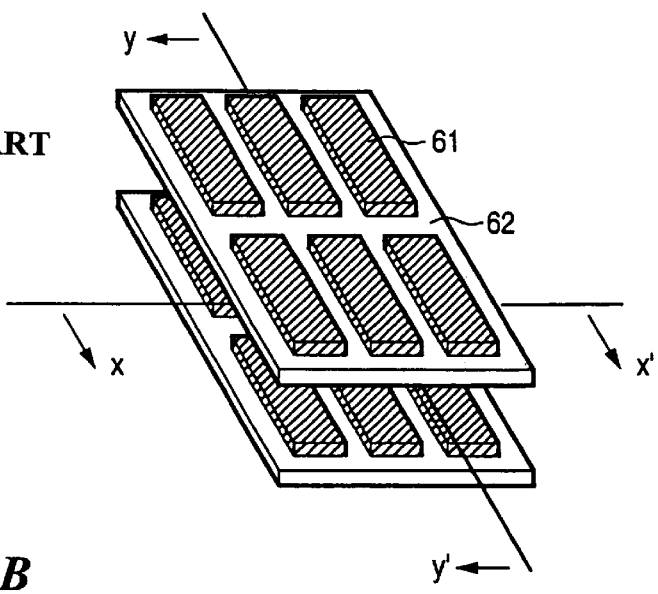
FIGS. 4A, 4B and 4C are diagrams showing the structure of a conventional laminate.
Figure 4B:
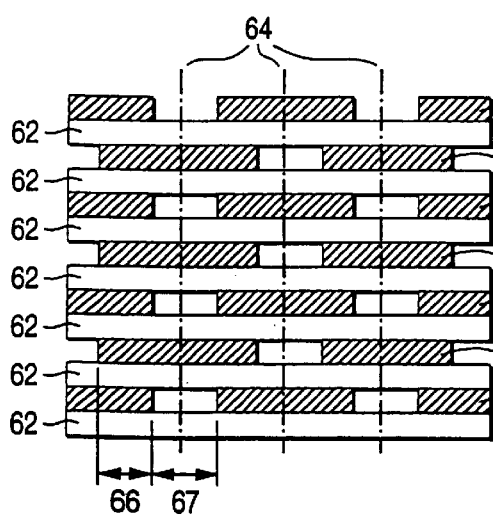
Figure 4C:
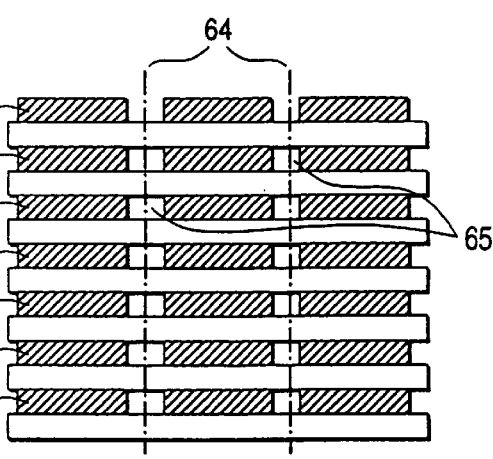
Figure 5:
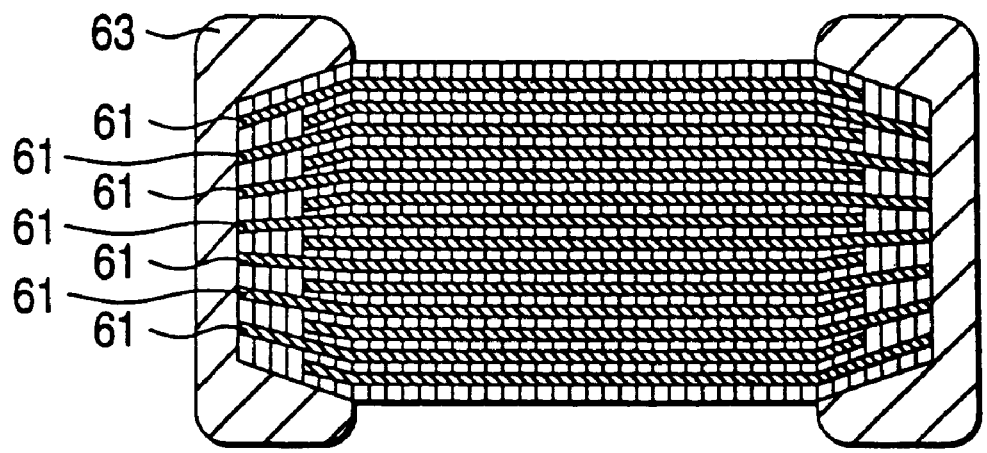
FIG. 5 is a cross sectional view showing a conventional multilayer ceramic chip capacitor.

The laminate having the laminated layers is cut along cutting lines 24, and then the cut laminates are burned. Then, external electrodes are printed to the ends of each laminate so that multilayer ceramic chip capacitors are manufactured. The cross section of the manufactured multilayer chip capacitor is shown in FIG. 3. The internal electrode portions 22 connected to the external electrodes 25 are flush with one another without any curvity, that is, the internal electrode portions 22 are substantially flattened.

The green internal electrode portions 22 are printed and formed by a thermal transfer method which uses a thermal transfer conductor material, while the green dielectric portions 23 are printed and formed by the same method which uses a thermal transfer dielectric material. Thus, arbitrary shapes can precisely be obtained by printing. Even if the green dielectric portions are continuously formed from the green internal electrode portions, seepage or the like can be prevented. Thus, substantially flat green internal electrode layers can easily be formed.

Since the thermal transfer printing method is able to easily form a thin structure, a very thin green dielectric layer can be formed by the thermal transfer printing method. As a result, a compact and large capacity multilayer ceramic chip capacitors can easily be manufactured.

As shown in FIG. 1, the thermal transfer member has a structure that a separation layer 2 mainly composed of wax is formed on the support member 1. A thermal transfer conductor layer 3a or a thermal transfer dielectric layer 3b is formed on the separation layer 2. Moreover, an adhesive layer 4 is formed on the thermal transfer conductor layer 3a or the thermal transfer dielectric layer 3b. In addition, the backcoat layer 5 is formed below the support member 1.

The foregoing layers will now be described in detail.

(Support Member)

It is preferable that the support member is made of a flexible material, more preferably a resin material. Although the resin material is not limited, anyone of polyethylene terephthalate, polyethylene naphthalate, polyamide and polyimide may be selected to realize required heating resistance and solvent resistance. Also the thickness of the support member is not limited, the thickness may be determined to realize required flexibility. Usually, it is preferable that the thickness is 1 µm to 10 µm.

(Separation Layer)

The separation layer contains wax as a main component thereof so as to be used in a process of the thermal head to generate heat so as to print the thermal transfer conductor layer or the dielectric layer onto the printing surface into a predetermined pattern. The separation layer has an effect to prevent retention of the conductor layer or the dielectric layer formed into the above-mentioned pattern on the surface of the support member made of the thermal transfer member so that the foregoing layer is completely be printed on the printing layer. If no separation layer is provided and thus the conductor layer or the dielectric layer is in direct contact with the surface of the support member, there is apprehension that a portion of the heated conductor layer or the dielectric layer is left on the support member when the thermal transfer printing process is performed. In this case, there is apprehension that a defect is caused in the green internal electrode portion or the green dielectric portion.

The separation layer must be melted during the thermal transfer printing method process. Therefore, the separation layer must have a characteristic which causes the conductor layer or the dielectric layer to easily be separated from the support member when the separation layer has been melted.

Therefore, it is preferable that the wax is animal or plant wax, such as bees wax, lanolin, carnauba wax, candelilla wax, montan wax, ceresin wax or rice bran wax or petroleum wax, such as paraffin wax or microcrystalline wax. Two or more types of the foregoing wax materials may be employed simultaneously. It is preferable that the melting point of the employed wax is 40° C. to 120° C., more preferably 60° C. to 90° C.

In general, the animal wax or plant wax is a solid ester composed of higher fatty acid and higher monohydric alcohol or dihydric alcohol. The petroleum wax is hydrocarbon expressed by general chemical formula $CnH2n+2$ having about 20 to about 60 carbon atoms and molecular weight of 300 to 1000. Although the animal wax, plant wax and the petroleum wax have different structures, the foregoing waxes are collectively called waxes because of similar characteristics. Any one of the foregoing waxes may be employed in the present invention.

Although it is preferable that the separation layer is composed of only the wax, the separation layer may contain other substances if the separating characteristic can be maintained. For example, thermoplastic resin or the like may be mixed if necessary to improve the adhesiveness to the support member so as to improve the durability of the thermal transfer conductor material or the thermal transfer dielectric material. Note that it is preferable that the content of the wax in the separation layer is at least 90 wt %.

Although the thickness of the separation layer may be determined in accordance with the heating performance of the thermal head and the heat resistance of the support member, it is preferable that the thickness is 0.1 µm to 1.5 µm.

If the separation layer is too thick, the conductor layer and the dielectric layer can easily be separated from the support member when it is handled before the thermal transfer printing operation is performed. Moreover, heat conduction from the thermal head to the conductor layer or the dielectric layer is not performed sufficiently when the thermal transfer operation is performed. Therefore, transference of the pattern cannot satisfactorily be performed and/or the resolution of the pattern deteriorates. Since organic components are increased during the printing operation, a degreasing operation cannot sufficiently be performed during the burning operation. In this case, the characteristics deteriorate and delamination easily occurs. If the separation layer is too thin, the function of the separation layer deteriorates, that is, transference of the pattern cannot completely be performed.

(Conductor Layer)

The conductor layer contains conductor particles and the thermoplastic resin. If necessary, the conductor layer may contain the foregoing wax. Since the type of the thermoplastic resin is not limited, it is preferable that thermoplastic resin of a type which is solid at room temperatures and which is softened when it is heated is employed.

For example, any one of the following materials or mixture of the same may be employed: ethylene-vinyl acetate copolymer, ethylene-alkylacrylate copolymer, ethylene-alkylmethacrylate copolymer, ethylene-glycidylmethacrylate-methylacrylate copolymer, polyolefine resin, polyvinyl alcohol, vinyl acetate resin, styrene-alkylmethacrylate copolymer, styrene-alkylacrylate copolymer and styrene resin. It is preferable that the softening point of the thermoplastic resin is 45° C. to 90° C. If the softening point is too high, the thermal transfer of the pattern cannot satisfactorily be performed. If the softening point is too low, a redundant portion adjacent to a heating pattern is transferred. Thus, a noise pattern can easily be formed.

The thermoplastic resin is characterized by the viscosity at temperatures higher than the softening point thereof, the viscosity being higher than the viscosity of the wax at temperatures higher than the melting point of the wax. When the thermoplastic resin is employed to form the conductor layer, seepage of the transferred pattern can be prevented.

On the other hand, solid wax is a brittle substance lacking flexibility. Since also adhesiveness to the support member is unsatisfactory, a crack is formed in the conductor layer if the quantity of the wax in the conductor layer is enlarged. Therefore, the solid wax has a problem that the conductor layer can easily be separated from the support member. Therefore, the ratio of the wax with respect to the total quantity of the thermoplastic resin and the wax in the conductor is 65 wt % or lower, more preferably 50 wt % or lower. Since the thermal sensitivity of the wax is higher than that of the thermoplastic resin, there is apprehension that the thermal transferring characteristic has a problem if the ratio of the wax is too low. Therefore, the ratio of the wax and the thermoplastic resin must be adjusted in accordance with the thermal transferring conditions.

The conductor particle is not limited. It is preferable that a metal material, an alloy or an oxide is employed which contains at least any one of Au, Ag, Pd, Cu, Ni, Co, Fe, Sn, Al, In, W, Mo, Ta, Pb, Bi, Zn and Cd. Usually, it is preferable that the particle size of the conductor particles is 0.1 µm to 10 µm.

It is preferable that the volume ratio of conductor particles with respect to the total volume of the thermoplastic resin and wax in the conductor layer is 0.5 to 2.6. If the quantity of the conductor particles is too small, the conductor particles in an electrode pattern (the green internal electrode portion) decrease after the thermal transfer printing operation has been performed. In this case, there is apprehension that the electrode pattern is interrupted during the burning process and the electric characteristics deteriorates. If the quantity of the conductor particles is too large, there is apprehension that the separation characteristic of the thermal transfer pattern deteriorates. In this case, a defect is sometimes caused in a printing process.

It is preferable that the thickness of the conductor layer is 0.3 µm to 3.0 µm. If the thickness of the conductor layer is too small, the pattern can easily be interrupted during the burning process because the quantity of conductor particles in the transferred electrode pattern is reduced. If the thickness of the conductor layer is too large, heat cannot easily be conducted from the thermal head. Thus, the transferring characteristic deteriorates, causing the quality of the transferred electrode pattern to deteriorate.

(Dielectric Layer)

The dielectric layer has a similar structure to that of the conductor layer. The dielectric layer contains dielectric particles in place of the conductor particles. The type of the dielectric particles which are contained in the dielectric layer is not limited. Materials for compensating temperatures or materials having a high dielectric constant for use in multilayer ceramic chip capacitors may be employed. Also the composition of the dielectric layer is not limited. It is preferable that barium titanate type material or perovskite containing lead is employed.

It is preferable that the thickness of the dielectric layer is 0.3 µm to 3.0 µm.

When the green dielectric layers, the green internal electrode portions and the green dielectric portions are sequentially printed by using the thermal transfer members so as to be laminated, the green internal electrode portions and the green dielectric portions are thermally transferred onto the printed green dielectric layers. Therefore, there is apprehension that a portion of the green dielectric layer is again melted by dint of an influence of heat generated by the thermal head. Thus, it is preferable that the dielectric layers, each of which made of the thermal transfer dielectric material for use to form the green internal electrode layers, does not contain wax. In addition to the thermoplastic resin, any one of polyurethane resin, cellulose resin, butyral resin, acrylic resin and polyethylene resin may be employed. As an alternative to this, a copolymer of the foregoing materials may be employed.

(Adhesive Layer)

The adhesive layer is provided for the purpose of preventing interruption of the pattern occurring when the thermal transferring process is performed. Moreover, the adhesive layer is provided for improving the adhesiveness of each of the green internal electrodes and the green dielectric portions or the green dielectric layers formed on the surface of the lamination. The adhesive layer contains the thermoplastic resin or both of the thermoplastic and the wax.

To enlarge the content of conductor particles in the green internal electrode portions which are transferred by the thermal transfer printing method and dielectric particles in the green dielectric layers, the adhesive layer may contain conductor particles or dielectric particles. The particle size of the particles may be determined to correspond to the thickness of the adhesive layer. That is, a necessity of using particles having the same particle size as that of particles contained in the dielectric layer or the conductor layer can be eliminated.

When the adhesive layers contain conductor particles or dielectric particles, it is preferable that the volume ratio of the particles with respect to the total volume of thermoplastic resin and wax in the adhesive layer is 0.45 or lower.

It is preferable that the thickness of the adhesive layer is 0.1 µm to 1.5 µm. If the thickness of the adhesive layer is too large, the density of particles in the green internal electrode layers or the green dielectric layers is lowered after the thermal transferring process has been performed. In this case, organic components which must be degreased are substantially increased. Thus, there is apprehension that the characteristic deteriorate and/or delamination occurs. If the thickness of the adhesive layer is too small, the required effect of the adhesive layer to fix the pattern which has been thermally transferred cannot satisfactorily be obtained.

(Backcoat Layer)

Since the thermal head slides on the reverse side of the thermal transfer member during the thermal transfer printing operation, the backcoat layer is provided if necessary for the purpose of reducing sliding resistance of the thermal head. It is preferable that the thickness of the backcoat layer is 0.1 µm to 1.0 µm. If the thickness of the backcoat layer is too small, a required effect cannot be obtained. If the foregoing thickness is too large, heat conduction from the thermal head cannot sufficiently be performed. As a result, thermal transfer of the pattern cannot sometimes completely be performed. The material for forming the backcoat layer is not limited if the employed material is able to realize a lubricating characteristic. It is preferable that at least one type of material of the following materials is employed: silicon oil, fluorine type oil, silicon resin containing foregoing oil, fluorine resin, epoxy resin, melamine resin, phenol resin, polyimide, nitrocellulose, butyral resin and acetal resin.

(Method of Forming Films)

It is preferable that the separation layer is formed by a coating method to manufacture the thermal transfer member. Specifically, a prepared water type wax emulsion containing an alcohol may be applied. As an alternative to this, a coating material may be prepared by directly dispersing wax in organic solvent, such as toluene, methylethylketone, acetone or alcohol. It is preferable that the coating operation is performed by employing a solvent coating method using any one of a bar coater, a doctor blade, gravure, flexo device and a nozzle.

The conductor layers or the dielectric layers can be formed by applying a coating material prepared by a similar method as that for forming the separation layers. Solvent constituting the coating material which must be applied may be solvent of a type which is able to dissolve the thermoplastic resin. For example, water, alcohol, acetone, methylethylketone or toluene may be employed. It is preferable that conductor particles and the thermoplastic resin, which are nonvolatile components in the coating material, are contained by 60 wt % or lower. If the concentration of the nonvolatile components is too high, the viscosity of the coating material is raised excessively. In this case, uniform coating cannot easily be performed. Thus, the thermal transfer member cannot easily be obtained.

(Thermal Transfer Printing)

The thermal transfer conductor material and the thermal transfer dielectric material are used to thermally transfer the green internal electrode portions and the green dielectric portions so as to form predetermined patterns on the dielectric layer which are substrates. Either of the green internal electrode portions or the green dielectric portions may be printed first. The thicknesses of the thermal transfer conductor material and the thermal transfer dielectric material must be the same to cause the green internal electrode portions and the green dielectric portions to have the same thicknesses. It is preferable that the difference between the thicknesses of the two materials is 0.5 μm or smaller. If the difference in the thickness is too large, a stepped portion is undesirably formed and, therefore, the flatness of the internal electrode layer deteriorates. Therefore, the green sheets cannot successively be laminated.

The thermal head raises the temperature to be not lower than the melting point of the employed wax. Moreover, the temperature must be not lower than the softening point of the thermoplastic material.

The heating medium is not limited to a specific medium. A variety of thermal heads, including a line-type thermal head and a serial-type thermal head, may be employed. As an alternative to this, a laser head using a laser beam may be employed.

Examples of the present invention will now be described.

EXAMPLE 1

The thermal transfer conductor material was prepared as follows: a polyethylene terephthalate film, which was composed of butyral resin containing silicon and which had a backcoat layer having a thickness of 0.5 μm was employed as the support member. Then, a wax layer having a thickness of 0.5 μm and serving as the separation layer was formed on the polyethylene terephthalate film.

Then, the following coating material was prepared:

| | |
|---|---|
| Ni particles (average particle size: 0.2 μm) | 36 parts by weight |
| Ethylene-vinyl acetate copolymer (softening point: 64° C.) | 4 parts by weight |
| Toluene | 60 parts by weight |

A conductor layer having a thickness of 1.5 μm was formed on the separation layer.

A coating material having the following composition was prepared:

| | |
|---|---|
| Barium titanate particles (average particle size: 0.1 μm) | 6.7 parts by weight |
| Ethylene-vinyl acetate copolymer (softening point: 64° C.) | 3.3 parts by weight |
| Toluene | 90 parts by weight |

An adhesive layer having a thickness of 0.6 μm was formed on the conductor layer so that the thermal transfer conductor material was prepared.

The thermal transfer dielectric material was prepared as follows: similarly to the thermal transfer conductor material, a polyethylene terephthalate film, which was composed of butyral resin containing silicon and which had a backcoat layer having a thickness of 0.5 μm was employed as the support member. Then, a wax layer having a thickness of 0.5 μm and serving as the separation layer was formed on the polyethylene terephthalate film.

Then, a coating material having the following composition was prepared:

| | |
|---|---|
| Barium titanate particles (average particle size: 0.1 μm) | 33.5 parts by weight |
| Ethylene-vinyl acetate copolymer (softening point: 64° C.) | 1.4 parts by weight |
| Wax (softening point: 73° C.) | 1.4 parts by weight |
| Toluene | 63.7 parts by weight |

A dielectric layer having a thickness of 1.5 μm was formed on the separation layer.

A coating material having the following composition was prepared:

| | |
|---|---|
| Barium titanate particles (average particle size: 0.1 μm) | 33.5 parts by weight |
| Ethylene-vinyl acetate copolymer (softening point: 64° C.) | 9 parts by weight |
| Toluene | 73 parts by weight |

An adhesive layer having a thickness of 0.6 μm was formed on the dielectric layer so that the thermal transfer dielectric material was prepared.

Then, a green dielectric layer which contained barium titanate particles having an average particle size of 0.1 μm and butyral resin and which had a thickness of 3 μm was formed on the support member having a separating characteristic and made of polyethylene terephthalate. Thus, a green dielectric sheet was manufactured. The green dielectric sheet was set to a thermal transfer printer so that predetermined green internal electrode portions and green dielectric portions were printed on the surface of the dielectric layer by a thermal transfer method by using the thermal transfer conductor material and the thermal transfer dielectric material. A fact was confirmed that the formed green internal electrode layer had a flat surfaces. A plurality of green sheets each having the flat green internal electrode layer were manufactured.

The green internal electrode layer of the green sheet was superimposed on the green dielectric layer which was composed of barium titanate particles having an average particle size of 0.35 μm and butyral resin and which had a thickness of 300 μm. The foregoing superimposing process was performed in such a manner that the green internal electrode layer was in contact with the dielectric layer having the thickness of 300 μm. Then, the laminated layers were applied with pressure so as to be crimped so that the support member was separated. The above-mentioned operation was repeated so that the green sheets were laminated. Thus, a green laminate having 100 green internal electrode layers was obtained. Then, a green dielectric layer, which was composed of barium titanate having an average particle size of 0.35 μm and butyral resin, and which had a thickness of 300 μm, was placed on the green laminate. Then, the layers were applied with pressure so as to be crimped, and then the layers were cut so that green laminate chips were manufactured.

After the green laminate chips were degreased, the green laminate chips were burned at 1260° C. in a furnace having a reducing atmosphere so that capacitor chips were manufactured. Then, end electrodes were joined so that multilayer ceramic chip capacitors were manufactured.

The dimensions of each capacitor were such that the length was 3.2 mm, the width was 1.6 mm and the height was 1.36 mm. When the capacitor was cut to observe the cross section, the thickness of each internal electrode portion was 1.2 μm, the effective area of the same was 2.4 mm² and the thickness of the dielectric member between the internal electrodes was 2.0 μm. A fact was confirmed that all layers were stably formed. The capacitor had a capacity of 2 μF which was a satisfactory value as one of capacity characteristics.

As a comparative example, a green dielectric layer which contained barium titanate particles having an average particle size of 0.1 μm and butyral resin and which had a thickness of 3 μm was formed on the support member having a separating characteristic and made of polyethylene terephthalate. Thus, a green dielectric sheet was manufactured. The green dielectric sheet was set to a thermal transfer printer so that green internal electrode portions were printed on the surface of the dielectric layer by a thermal transfer method. A tact was confirmed that the formed green internal electrode layer had a flat surfaces. A plurality of green sheets each having the flat green internal electrode layer were manufactured. A plurality of green sheets each having only the green internal electrode portion were manufactured.

The green internal electrode layer of the green sheet was superimposed on the green dielectric layer which was composed of barium titanate particles having an average particle size of 0.35 μm and butyral resin and which had a thickness of 300 μm. The foregoing superimposing process was performed in such a manner that the green internal electrode layer is in contact with the dielectric layer having the thickness of 300 μm. Then, the laminated layers were applied with pressure so as to be crimped so that the support member was separated. Although the foregoing operation was attempted to be performed successively to laminate the green sheets, the unsatisfactory degree of crimping in the spaces inhibits easy separation of the green sheets from the support member in a plurality of laminated layers. As a result, continuation of the laminating process was difficult.

EXAMPLE 2

The thermal transfer conductor material was prepared as follows: a polyethylene terephthalate film, which was composed of butyral resin containing silicon and which had a backcoat layer having a thickness of 0.5 μm, was employed as the support member. Then, a wax layer having a thickness of 0.5 μm and serving as the separation layer was formed on the polyethylene terephthalate film.

Then, the following coating material was prepared:

| | |
|---|---|
| Ni particles (average particle size: 0.2 μm) | 34.3 parts by weight |
| Ethylene-glycidyl methacrylate-methylacrylate copolymer resin (softening point: 52° C.) | 3.4 parts by weight |
| Wax (softening point 73° C.) | 2.3 parts by weight |
| Toluene | 60 parts by weight |

A conductor layer having a thickness of 1.5 μm was formed on the separation layer.

The following coating material was prepared:

| | |
|---|---|
| Barium titanate particles (average particle size: 0.1 μm) | 10 parts by weight |
| Ethylene-glycidyl methacrylate-methylacrylate copolymer resin (softening point: 52° C.) | 3.5 parts by weight |
| Wax (softening point: 73° C.) | 1.5 parts by weight |
| Toluene | 85 parts by weight |

An adhesive layer having a thickness of 0.8 μm was formed on the conductor layer so that the thermal transfer conductor material was prepared.

The thermal transfer dielectric material was prepared as follows: similarly to the thermal transfer conductor material, a polyethylene terephthalate film, which was composed of butyral resin containing silicon and which had a backcoat layer having a thickness of 0.5 μm, was employed as the support member. Then, a wax layer having a thickness of 0.5 μm and serving as the separation layer was formed on the polyethylene terephthalate film.

The following coating material was prepared:

| | |
|---|---|
| Barium titanate particles (average particle size: 0.1 μm) | 32 parts by weight |
| Ethylene-glycidyl methacrylate-methylacrylate copolymer resin (softening point: 52° C.) | 1.5 parts by weight |
| Wax (softening point: 73° C.) | 1.5 parts by weight |
| Toluene | 65 parts by weight |

A conductor layer having a thickness of 1.5 μm was formed on the separation layer.

The following coating material was prepared:

| | |
|---|---|
| Barium titanate particles (average particle size: 0.1 μm) | 10 parts by weight |
| Ethylene-glycidyl methacrylate-methylacrylate copolymer resin (softening point: 52° C.) | 3.5 parts by weight |
| Wax (softening point: 73° C.) | 1.5 parts by weight |
| Toluene | 85 parts by weight |

An adhesive layer having a thickness of 0.8 μm was formed on the dielectric layer so that the thermal transfer dielectric material was prepared.

Then, a green dielectric layer which contained barium titanate particles having an average particle size of 0.1 μm and butyral resin and which had a thickness of 1.8 μm was formed on the support member having a separating characteristic and made of polyethylene terephthalate. Thus, a green dielectric sheet was manufactured. The green dielectric sheet was set to a thermal transfer printer so that predetermined green internal electrode portions and green dielectric portions were printed on the surface of the dielectric layer by a thermal transfer method by using the conductor material and the thermal transfer dielectric material.

In a state in which the obtained structure was maintained in the thermal transfer printer, the green dielectric sheet was superimposed on the foregoing structure so as to be applied with pressure and crimped so that the support member was removed. Thus, a new surface of the green dielectric layer was formed. In the foregoing case, the lower green internal electrode layer was flattened. Therefore, any rise of the internal electrode portion was not confirmed.

Then, the thermal transfer conductor material and the thermal transfer dielectric material was used to thermaltransfer-print predetermined green internal electrode portions and green dielectric portions on the new surface of the green dielectric layer. Thus, a second green internal electrode layer was formed. The foregoing laminating process was repeated so that a green laminate having 50 green internal electrode layers was manufactured.

Then, the green laminate was taken from the thermal transfer printer. Then, the green internal electrode layer of the green laminate printed finally was superimposed on the green dielectric layer which was composed of barium titanate particles having an average particle size of 0.35 μm and butyral resin and which had a thickness of 300 μm. The superimposition was performed such that the green internal electrode layer printed finally faced the green dielectric layer having the thickness of 300 μm. Then, pressure was applied to perform compression so that the support member of the green laminate was removed.

Then, a green dielectric layer which was composed of barium titanate particles having an average particle size of 0.35 μm and butyral resin and which had a thickness of 300 μm were superimposed on the foregoing laminate. Then, pressure was applied so that the laminate was crimped, and then the laminate was cut. Thus, green laminate chips were manufactured. After the green laminate chips were degreased, the green laminate chips were burned at 1260° C. in a furnace having a reducing atmosphere so that capacitor chips were manufactured. Then, end electrodes were joined so that multilayer ceramic chip capacitors were manufactured.

The dimensions of each capacitor were such that the length was 3.2 mm and the width was 1.6 mm. When the capacitor was cut to observe the cross section, the thickness of each internal electrode portion was 1.2 μm, the effective area of the same was 2.4 mm$^2$ and the thickness of the dielectric member between the internal electrodes was 1.4 μm. A fact was confirmed that all layers were stably formed. The capacitor had a capacity of 1.5 μF which was a satisfactory value as one of capacity characteristics.

If a similar manufacturing process is employed to manufacture the capacitor incorporating the green internal electrode layer which is composed of only the green internal electrode portion, a lower green internal electrode portion is raised and allowed to appear on the surface of the upper green dielectric sheet. As a result, the flatness deteriorates. Therefore, a thermal transfer printing process to which the surface of the green dielectric sheet is subjected results in a portion being formed to which heat is irregularly conducted from the thermal head. As a result, a precise printing process cannot be performed. Thus, the thermal transfer printing operation for obtaining a green laminate cannot completely be performed.

EXAMPLE 3

The thermal transfer conductor material was prepared as follows: a polyethylene terephthalate film, which was composed of butyral resin containing silicon and which had a backcoat layer having a thickness of 0.5 μm, was employed as the support member. Then, a wax layer having a thickness of 0.5 μm and serving as the separation layer was formed on the polyethylene terephthalate film.

Then, the following coating material was prepared:

| | |
|---|---|
| Ni particles (average particle size: 0.1 μm) | 34.3 parts by weight |
| Ethylene-glycidyl methacrylate-methylacrylate copolymer resin (softening point: 52° C.) | 3.4 parts by weight |
| Wax (softening point 73° C.) | 2.3 parts by weight |
| Toluene | 60 parts by weight |

A conductor layer having a thickness of 1.0 μm was formed on the separation layer.

The following coating material was prepared:

| | |
|---|---|
| Ni particles (average particle size: 0.05 μm) | 8.6 parts by weight |
| Ethylene-glycidyl methacrylate-methylacrylate copolymer resin (softening point: 52° C.) | 3 parts by weight |
| Wax (softening point: 73° C.) | 0.4 parts by weight |
| Toluene | 88 parts by weight |

An adhesive layer having a thickness of 0.5 μm was formed on the conductor layer so that the thermal transfer conductor material was prepared.

The thermal transfer dielectric material was prepared as follows: similarly to the thermal transfer conductor material, a polyethylene terephthalate film, which was composed of butyral resin containing silicon and which had a backcoat layer having a thickness of 0.5 μm, was employed as the support member. Then, a wax layer having a thickness of 0.5 μm and serving as the separation layer was formed on the polyethylene terephthalate film.

The following coating material was prepared:

| | |
|---|---|
| barium titanate particles (average particle size: 0.1 μm) | 32 parts by weight |
| Ethylene-glycidyl methacrylate-methylacrylate copolymer resin (softening point: 52° C.) | 1.5 parts by weight |
| Wax (softening point: 73° C.) | 1.5 parts by weight |
| Toluene | 65 parts by weight |

A conductor layer having a thickness of 1.1 μm was formed on the separation layer.

The following coating material was prepared:

| | |
|---|---|
| Barium titanate particles (average particle size: 0.1 μm) | 10 parts by weight |
| Ethylene-glycidyl methacrylate-methylacrylate copolymer resin (softening point: 52° C.) | 3.5 parts by weight |
| Wax (softening point: 73° C.) | 1.5 parts by weight |
| Toluene: | 85 parts by weight |

An adhesive layer having a thickness of 0.5 μm was formed on the dielectric layer so that the thermal transfer dielectric material A was prepared.

Then, a polyethylene terephthalate film, which was composed of butyral resin containing silicon and which had a backcoat layer having a thickness of 0.5 μm, was employed as the support member. Then, a wax layer having a thickness of 0.5 μm and serving as the separation layer was formed on the polyethylene terephthalate film.

Then, the following coating material was prepared:

| | |
|---|---|
| Barium titanate particles (average particle size: 0.1 μm) | 37.5 parts by weight |
| Butyral resin (glass transition point: 58° C.) | 3.0 parts by weight |
| Toluene | 59.5 parts by weight |

A dielectric layer having a thickness of 1.5 μm was formed on the separation layer.

The following coating material was prepared:

| | |
|---|---|
| Barium titanate particles (average particle size: 0.1 μm) | 10 parts by weight |
| Ethylene-glycidyl methacrylate-methylacrylate copolymer resin (softening point: 52° C.) | 3.5 parts by weight |
| Wax (softening point: 73° C.) | 1.5 parts by weight |
| Toluene | 85 parts by weight |

An adhesive layer having a thickness of 0.5 μm was formed on the dielectric layer so that the thermal transfer dielectric material B was prepared.

Then, a green dielectric layer which contained barium titanate particles having an average particle size of 0.1 μm and butyral resin and which had a thickness of 3 μm was formed on the support member having a separating characteristic and made of polyethylene terephthalate. Thus, a green dielectric sheet was manufactured. The green dielectric sheet was set to a thermal transfer printer so that predetermined green internal electrode portions and green dielectric portions were printed on the surface of the dielectric layer by a thermal transfer method by using the thermal transfer conductor material and the thermal transfer dielectric material A. A fact was confirmed that the formed internal electrode layers were flattened. However, burrs formed in the boundaries among the layers were removed by performing a calendering process such that the positions in the thermal transfer printer were maintained. Then, a green dielectric layer was formed on the laminate by thermal printing using the thermal transfer dielectric material B. Since the green internal electrode layer was flattened, no rise was observed on the surface of the green dielectric layer composed of the thermal transfer dielectric material B.

Then, the green internal electrode layers and the green dielectric layers were alternately printed by the thermal transfer method so that a green laminate having 50 internal electrode layers was manufactured.

Then, the green laminate was taken from the thermal transfer printer. Then, the internal electrode layer printed finally was superimposed on the green dielectric layer which was composed of barium titanate particles having an average particle size of 0.35 μm and butyral resin and which had a thickness of 300 μm. The superimposition was performed such that the internal electrode layer printed finally faced the green dielectric layer. Then, pressure was applied so that crimping is performed to remove the support member of the green laminate.

Then, a green dielectric layer, which was composed of barium titanate having an average particle size of 0.35 μm and butyral and which had a thickness of 300 μm was super imposed on the foregoing laminate. Then, the laminate was applied with pressure and crimped, and then cut. Thus, green laminate chips were manufactured. After the green laminate chips were degreased, the green laminate chips were burned at 1260° C. in a furnace having a reducing atmosphere so that capacitor chips were manufactured. Then, end electrodes were joined so that multilayer ceramic chip capacitors were manufactured.

The dimensions of each capacitor were such that the length was 3.2 mm and the width was 1.6 mm. When the capacitor was cut to observe the cross section, the thickness of each internal electrode portion was 1.0 μm, the effective area of the same was 2.4 mm$^2$ and the thickness of the dielectric member between the internal electrodes was 1.0 μm. A fact was confirmed that all layers were stably formed. The capacitor had a capacity of 2 μF which was a satisfactory value as one of capacity characteristics.

When a similar manufacturing process is performed such that the green internal electrode layer was composed of only the green internal electrode portion and the green dielectric layer is printed by the thermal transfer printing process without performing the calendering process, a rise of the lower green internal electrode portion appears on the surface of the green dielectric member. As a result, the flatness deteriorates. Therefore, a thermal transfer printing process to which the surface of the green dielectric sheet is subjected results in a portion being formed to which heat is irregularly conducted from the thermal head. As a result, a precise printing process cannot be performed. Thus, the thermal transfer printing operation for obtaining a green laminate cannot completely be performed. As a result, a laminate structure cannot easily be obtained.

According to the present invention, a compact and reliable multilayer ceramic element can be provided.

What is claimed is:

1. A method of manufacturing a multilayer ceramic electronic element, comprising the steps of:

forming a green internal electrode portion by thermally transfer-printing, on a green dielectric layer formed on a support member, a thermal transfer conductor material by a first thermal transfer printing method; and forming a green dielectric portion by thermally transfer-printing, on a surface of said green dielectric layer at where said green internal electrode portion is not formed and which is flush with said green internal electrode portion, a thermal transfer dielectric material by a second thermal transfer printing method so that a substantially flat green internal electrode layer is formed.

2. A method of manufacturing a multilayer ceramic electronic element according to claim 1, wherein said green dielectric layer is formed on said support member by a third thermal transfer printing method using said thermal transfer dielectric material.

3. A method of manufacturing a multilayer ceramic electronic element according to claim 2, wherein said thermal transfer conductor material is formed by sequentially laminating, on said support member, a separation layer mainly composed of wax, a conductor layer mainly composed of thermoplastic resin, wax and conductor particles or the thermoplastic resin and the conductor particles and an adhesive layer mainly composed of thermoplastic resin and wax or the thermoplastic resin and said thermal transfer dielectric material is formed by sequentially laminating, on said support member, a separation layer mainly composed of wax, a dielectric layer mainly composed of thermoplastic resin, wax and dielectric particles or the thermoplastic resin and the dielectric particles and adhesive layer mainly composed of thermoplastic resin and wax or the thermoplastic resin.

4. A method of manufacturing a multilayer ceramic electronic element according to claim 1, wherein said thermal transfer conductor material is formed by sequentially laminating, on said support member, a separation layer mainly composed of wax, a conductor layer mainly composed of thermoplastic resin, wax and conductor particles or the thermoplastic resin and the conductor particles and an adhesive layer mainly composed of thermoplastic resin and wax or the thermoplastic resin and said thermal transfer dielectric material is formed by sequentially laminating, on said support member, a separation layer mainly composed of wax, a dielectric layer mainly composed of thermoplastic resin, wax and dielectric particles or the thermoplastic resin and the dielectric particles and adhesive layer mainly composed of thermoplastic resin and wax or the thermoplastic resin.

5. A method of manufacturing a multilayer ceramic electronic element according to any one of claims 1 to 3, wherein a surface of said green internal electrode layer is subjected to a calendering process so that the surface of said green internal electrode layer is flattened.

* * * * *